(12) United States Patent
Oliva et al.

(10) Patent No.: US 8,413,902 B2
(45) Date of Patent: Apr. 9, 2013

(54) IMAGE ACQUISITION DEVICE AND OPTICAL COMPONENT THEREOF

(75) Inventors: Guido Maurizio Oliva, Rovigo (IT); Federico Canini, Zola Predosa (IT)

(73) Assignee: Datalogic Scanning Group S.R.L., Lippo di Calderara di Reno, Bo (IT)

( * ) Notice: Subject to any disclaimer, the term of this patent is extended or adjusted under 35 U.S.C. 154(b) by 0 days.

(21) Appl. No.: 12/676,068

(22) PCT Filed: Sep. 7, 2007

(86) PCT No.: PCT/IT2007/000620
§ 371 (c)(1), (2), (4) Date: Mar. 2, 2010

(87) PCT Pub. No.: WO2009/047810
PCT Pub. Date: Apr. 16, 2009

(65) Prior Publication Data
US 2010/0214466 A1    Aug. 26, 2010

(51) Int. Cl.
*G06K 7/10* (2006.01)

(52) U.S. Cl.
USPC .......................................................... 235/454

(58) Field of Classification Search ............ 235/454, 235/462.43
See application file for complete search history.

(56) References Cited

U.S. PATENT DOCUMENTS

| | | | |
|---|---|---|---|
| 4,957,356 A | 9/1990 | Oizumi et al. | |
| 5,185,514 A * | 2/1993 | Wike et al. | 235/375 |
| 5,231,277 A * | 7/1993 | Aritake et al. | 235/462.4 |
| 5,515,206 A | 5/1996 | Peng | |
| 5,784,209 A | 7/1998 | Manabe | |
| 6,053,408 A | 4/2000 | Stoner | |
| 6,164,546 A * | 12/2000 | Kumagai et al. | 235/472.01 |
| 6,208,468 B1 | 3/2001 | Togino et al. | |
| 6,271,975 B1 | 8/2001 | Grupp | |
| 6,866,197 B1 * | 3/2005 | Detwiler et al. | 235/462.39 |
| 2003/0029915 A1 | 2/2003 | Barkan et al. | |
| 2003/0123044 A1 | 7/2003 | Oka | |
| 2003/0198444 A1 | 10/2003 | Mine et al. | |
| 2006/0034550 A1 | 2/2006 | Wen | |
| 2006/0175411 A1 | 8/2006 | Itou | |
| 2006/0249661 A1 | 11/2006 | Ishigami et al. | |

FOREIGN PATENT DOCUMENTS

| | | |
|---|---|---|
| EP | 0703543 A | 3/1996 |
| EP | 0833273 A | 4/1998 |
| EP | 1074854 A1 | 2/2001 |
| EP | 1172756 A1 | 1/2002 |
| EP | 0652530 B1 | 9/2005 |
| EP | 1662278 A1 | 5/2006 |
| EP | 1804089 A1 | 7/2007 |
| WO | WO2005114264 A | 12/2005 |

OTHER PUBLICATIONS

International Search Report and Written Opinion dated Dec. 3, 2008 in corresponding PCT Application No. PCT/IT2007/000620.
International Preliminary Report on Patentability, dated Mar. 18, 2010, in corresponding International Patent Application No. PCT/IT2007/000620, issued by the International Bureau of WIPO.

* cited by examiner

*Primary Examiner* — Jamara Franklin
(74) *Attorney, Agent, or Firm* — Duane Morris LLP

(57) ABSTRACT

An optical component of an image acquisition device includes at least two faces each having a first optically active region, the first optically active regions of the at least two faces being assigned to optical functions homologous to each other, but according to different acquisition configurations, the at least two faces defining respective reference planes, the normals to the reference planes being differently oriented.

40 Claims, 9 Drawing Sheets

IMAGE ACQUISITION DEVICE AND OPTICAL COMPONENT THEREOF

FIELD OF THE INVENTION

The present invention concerns an image acquisition device and an optical component thereof.

Such an image acquisition device can in particular be a device, preferably an imaging device, for reading one-dimensional or two-dimensional optical codes, an artificial vision and inspection system, and similar.

BACKGROUND OF THE INVENTION

In the case of an optical code reader, the processing of the acquired image makes it possible to identify the characteristics of the elements of the code, such as the width and/or the number of bands and spaces in the case of barcodes or stacked codes, the magnitude of two-dimensional elements in the case of two-dimensional codes, the colour in the case of colour codes, etc. Such characteristics encode the most widely varying information associated with any object carrying the optical code.

Just as an example, in the fields of transportation, of delivery and of storage of goods, optical codes make it possible to easily keep track of goods.

Similarly, in artificial vision and inspection systems an area is illuminated and an image thereof is acquired for its remote display or for the most widely varying subsequent processing, according to the intended purpose.

In such image acquisition devices it is necessary to illuminate the entire width of a 1D code or an entire 2D code, or more generally the entire area of which an image is to be acquired, and to collect and detect the light diffused by the code or by the area through a suitable photodetector device or sensor.

Image acquisition devices have different critical aspects.

Both in the one-dimensional case and in the two-dimensional case, the performance of an image acquisition device is optimal only within a certain depth of field, meant as the range of distances between the image acquisition device and the optical code or the area of which the image is to be acquired.

The acquisition distance can, however, change greatly according to the intended application, or even within the same application, as the conditions change.

The depth of field depends greatly upon the receiving optics of the image acquisition device and is affected by the sources and by the optics for illuminating the area to be acquired.

In order to increase the depth of field, autofocus devices are known that typically provide for electromechanical movement of parts of the optics. Such autofocus devices substantially increase the bulk, the weight, the cost, and the complexity of image acquisition devices.

It has also been proposed to provide for acquisition devices with two different acquisition subsystems, having depths of field centered at different distances, so that the overall depth of field of the acquisition device results from the juxtaposition of the two depths of field. Practical embodiments of such acquisition devices, however, provide for use of various optical components for forming two suitable illumination patterns and for imaging on two sensors, as well as of mirrors for deflecting the collected light onto the two sensors, also in this case substantially increasing the bulk, the weight, the cost and the complexity of image acquisition devices.

In image acquisition systems it is essential to ensure a predetermined mutual positioning or alignment in the broadest sense that is very precise between all of the optical, mechanical and optoelectronic components in order to make performance optimal. It follows from this that, if the number of components to be assembled substantially increases, the production and/or installation cost increases proportionally.

In particular, in the case of portable, hand-held or wearable, for example wrist- or finger-wearable image acquisition devices, the weight and bulk must be kept particularly low to allow a prolonged use thereof. Acquisition devices weighing from 50 g to 100 g and with size of about 50-70 mm×50-70 mm×50-70 mm, like those currently on the market, are tiring and therefore not very ergonomic.

Then in the case of complex portable or fixed processing systems, the image acquisition is often associated with other optoelectronic functions, including the projection of a luminous aiming figure, used for the correct positioning of the device with respect to the area from which the image is to be acquired; the projection of a luminous outcome figure, i.e. indicative of the positive or negative outcome and of possible reasons for negative outcome of the acquisition and/or processing of the image and/or decoding in the case of an optical code reader; the optoelectronic detection of presence of an image to be acquired, in particular of an optical code, in the field of view of the acquisition device; the optoelectronic distance measurement, to provide feedback on the position of the image to be acquired with respect to the acquisition device, possibly through triangulation; the transmission, reception or transmission/reception of information, for example for the transmission of the acquired image, or of a processed version thereof, to an external device.

All or part of these functions can be carried out by exploiting electromagnetic radiation with continuous spectrum or with different wavelengths and selected in suitable ranges, according to the intended purpose.

Such functions require the use of additional optoelectronic subsystems, which leads to an increase in the number of optical components to be assembled, as well as to an increase in weight and bulk of the image acquisition device if integrated in it. Vice-versa, should the aforementioned subsystems not be integrated into the image acquisition device, the space available for the latter can in any case be extremely small.

The technical problem at the basis of the present invention is to provide an image acquisition device and an optical component thereof that provide good performance and versatility with respect to one or more of the aforementioned requirements, in particular that are particularly compact and light and simple to assemble, in particular intrinsically capable of ensuring the correct mutual positioning of the different optical, mechanical and optoelectronic components.

SUMMARY OF THE INVENTION

The invention concerns, in a first aspect thereof, an optical component of an image acquisition device, comprising at least two faces each having a first optically active region, said first optically active regions of said at least two faces being assigned to optical functions homologous to each other, but according to different acquisition configurations, said at least two faces defining respective reference planes, the normals to the reference planes being differently oriented.

The provision in the same optical component of at least two faces comprising respective regions assigned to homologous optical functions associated with different acquisition configurations allows at least two different acquisition configurations of the same type to be made, for example two illumination and/or imaging, or aiming or outcome indicating or any other optical function configuration, differing in focusing distance, wavelength used, type of image to be acquired, etc., by simply suitably selecting the optical characteristics of the regions of the faces of the component and/or their number and their mutual positioning. Therefore, two acquisition configurations are meant as different if they differ in the value of at least one characteristic parameter (focal distance, field of view, wavelength, etc.) of at least one of the optical functions carried out (illumination, imaging, aiming, etc.). Moreover, by providing that such faces have a different orientation it is possible to reduce the size and therefore the weight of the optical component. Furthermore, the assembly operations are particularly simplified since the mutual positioning of the optically active regions is already intrinsically predetermined and therefore no alignments and individual calibrations are required.

Preferably, said homologous optical functions are functions identically selected from the group consisting of illumination beam shaping, imaging, aiming, indication, distance measurement including triangulation, presence detection, information transmission, information reception, information transmission/reception.

In the rest of the present disclosure, the illumination beam shaping function shall sometimes be indicated as illumination function for the sake of brevity.

Preferably, the normals to the reference planes form an angle of 90°.

However, different angles of orientation are also possible to make a greater number of faces having optically active regions associated with homologous optical functions, and therefore a greater number of different acquisition configurations.

Preferably, said at least two faces each further comprise at least one second optically active region assigned to at least one optical function not homologous to the optical functions of said first optically active regions.

The integration of optically active regions associated with different functions allows the size and the weight of the image acquisition device comprising such an optical component to be reduced even further.

More specifically, said at least one non-homologous optical function is also selected from the group consisting of illumination beam shaping, imaging, aiming, indication, distance measurement including triangulation, presence detection, information transmission, information reception, information transmission/reception.

In a particularly preferred way said at least two faces comprise at least two pairs each formed of at least one optically active region assigned to an illumination beam shaping function and at least one optically active region assigned to an imaging function.

In this way the optical component is suitable for providing two different acquisition subsystems.

Preferably, at least one region of at least one face is selected from the group consisting of a flat refractive surface, a refractive surface of locally defined arbitrary shape, a diffractive surface, and a polyhedral surface.

Refractive surfaces of locally defined arbitrary shape are described in EP 1 804 089 A1, incorporated herein by reference.

Polyhedral surfaces are described in EP 1 172 756 B1, incorporated herein by reference.

Said at least one region is advantageously used with illumination beam shaping, aiming, and signalling optical function.

Alternatively or in addition, preferably at least one region of at least one face is selected from the group consisting of a spherical refractive surface, an aspherical refractive surface, a toroidal refractive surface, and a diffractive surface.

Said at least one region is advantageously used with imaging optical function.

Preferably, the component further comprises at least one face having at least one region configured to deflect light internally of the component.

The deflection internal to the component makes it possible to optically associate with each other optically active regions of faces of the component that are not parallel. In this way, it is possible to obtain a particularly compact optical component, as well as to suitably orientate the optoelectronic components of the acquisition device of which the optical component is part with respect to a face thereof interfacing with the area of which the image is to be acquired.

In the present description and in the attached claims, by the expression "optically associated" it is meant to indicate regions and/or components the configuration and/or the mutual positioning of which are such as to convey a light beam from one to the other region/component, possibly suitably changing its characteristics such as shape, direction and local intensity, according to the intended optical function. (In particular, the optical association can consist of an optical alignment.)

In a first embodiment, particularly suitable for an image acquisition device having two light emitters and two sensors, the component comprises faces arranged along or parallel to the lateral surface of a right angle polyhedron with rectangular trapezium-shaped cross-section.

Preferably, the face along the oblique side forms an angle of 45° with the face along the major base.

In a particularly preferred manner:
the minor base face and the right angle side face each comprise at least one first region that is flat refractive, refractive of locally defined arbitrary shape, or diffractive, and a second region having the shape of a spherical refractive, aspherical refractive, toroidal refractive or diffractive surface;
the oblique side face is configured to deflect light internally of the optical component;
the major base face comprises at least one first region optically associated with the first region of the minor base face, that is flat refractive, refractive of locally defined arbitrary shape, or diffractive; a second region optically associated with the second region of the minor base face and having the shape of a spherical refractive, aspherical refractive, toroidal refractive or diffractive surface; a third region optically associated with the first region of the right angle side face through said oblique side face, that is flat refractive, refractive of locally defined arbitrary shape, or diffractive; and a fourth region optically associated with the second region of the right angle side face through said oblique side face, and having the shape of a spherical refractive, aspherical refractive, toroidal refractive or diffractive surface.

In order to also provide an aiming or outcome indication function, or another function among those described above, preferably said regions from the first to the fourth of said major base face are arranged as a square and said major base face further comprises a central region; said minor base face comprises a further optically active region optically associated with the central region of the major base face; said central region and further region being independently selected from the group consisting of flat refractive, refractive of locally defined arbitrary shape, diffractive or polyhedral surfaces.

In other embodiments, particularly suitable for an image acquisition device having just one light emitter and just one sensor, the component comprises faces arranged in pairs parallel to one another.

In a particularly preferred manner, each face comprises at least one first region that is flat refractive, refractive of locally defined arbitrary shape, or diffractive, and at least two faces each comprise at least one second region having the shape of a spherical refractive, aspherical refractive, toroidal refractive or diffractive surface, the first regions of faces of a pair of faces parallel to each other being optically associated, and the second regions of faces of a pair of faces parallel to each other being optically associated.

In an embodiment, said pairs of faces parallel to each other are two in number, the faces of one pair being perpendicular to the faces of the other pair.

In other embodiments said faces arranged in pairs parallel to each other are arranged along the sides of a polygon with an even number of sides.

In this way it is possible to make more than two homologous optical functions, and therefore more than two acquisition configurations.

In order to also provide a aiming or outcome indication function, or another function among those described above, at least one face can have at least one further optically active region selected from the group consisting of a flat refractive, a refractive of locally defined arbitrary shape, a diffractive and a polyhedral surface.

In order to avoid interference with an illumination function, at least one light guide can extend from said at least one further optically active region of said at least one face to a parallel face of said component.

Advantageously, in terms of weight and cost, at least one face of the component is made of a plastic material.

Even more preferably, to make it easier to produce the optical component, said at least one face is made by moulding.

The component can further comprise an inner screen.

Advantageously, such an inner screen separates an illumination beam shaping section on one side and an imaging section on the other, to avoid direct illumination of the sensor(s) of the image acquisition device by its emitter(s).

Such a screen can for example consist of an opaque inner wall should the body of the transparent optical component be hollow, or made of an opaque plastic material co-moulded with the transparent material to make a solid optical component.

The various faces of the optical component can be fixed onto a support framework. Preferably, however, the component is monolithic.

In another aspect thereof, the invention concerns an optical component of an image acquisition device, comprising at least two pairs each formed of at least one optically active region assigned to an illumination beam shaping function, and at least one optically active region assigned to an imaging function, said at least two pairs of optically active regions being configured according to different acquisition configurations.

In another aspect thereof, the invention concerns an image acquisition device comprising a component as described above, and a printed circuit suitable to face a face of said optical component.

Preferably, said printed circuit comprises at least one light emitter and at least one image sensor, respectively able to be optically associated with at least one optically active region of said component.

In order to also allow the simultaneous use of at least two different image acquisition configurations, the device can further comprise at least one second printed circuit able to be fixed parallel to a face of said component adjacent to said face to which said printed circuit can be fixed.

Preferably, said second printed circuit comprises at least one light emitter and at least one image sensor, respectively able to be optically associated with at least one optically active region of said component.

The device can further comprise electronics for driving said emitters and sensors of said first and second printed circuit.

Preferably, said drive electronics comprise at least one detector of an acquisition condition and provides for switching on the emitter and the sensor of the first printed circuit or the emitter and the sensor of the second printed circuit based upon the detected acquisition condition.

Preferably, said detector is a distance measurement system, even more preferably integrated in the image acquisition device and exploiting the optical component itself.

Alternatively, said drive electronics provides for switching on the emitter and the sensor of the first printed circuit in a first half-cycle and the emitter and the sensor of the second printed circuit in a second half-cycle.

The device can further comprise at least one apertured screen having at least one aperture optically associated with at least one region of at least one face of the optical component.

In order to make the image acquisition device even more compact, but only allow the alternate use of at least two different image acquisition configurations, the device can further comprise a mechanism for rotating the optical component between a first acquisition configuration wherein said printed circuit faces a first face of said optical component, and at least one second acquisition configuration wherein said printed circuit faces a second face of said optical component.

Preferably, said optical component is partially hollow and the device further comprises an imaging lens housed in the cavity of the optical component, able to be optically associated with at least one optically active region having imaging function of said optical component.

The device can further comprise at least one further light emitter associated with an aiming or indication function.

BRIEF DESCRIPTION OF THE DRAWINGS

Characteristics and advantages of the invention shall now be illustrated with reference to embodiments represented as a non-limiting example in the attached drawings, wherein.

DETAILED DESCRIPTION

Figure 1:
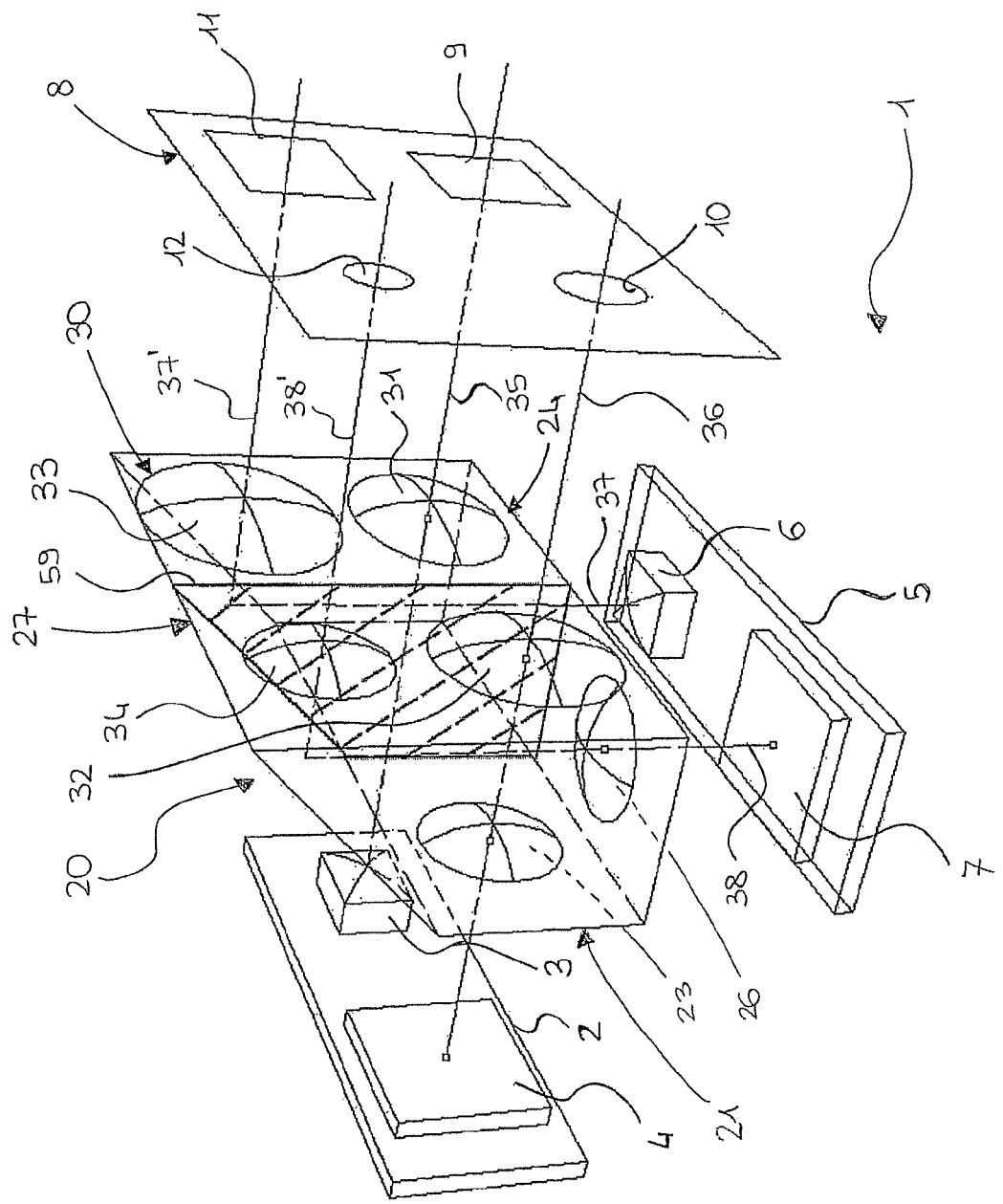
FIGS. 1 and 2 show a first embodiment of an image acquisition device and of an optical component thereof.
Figure 2:
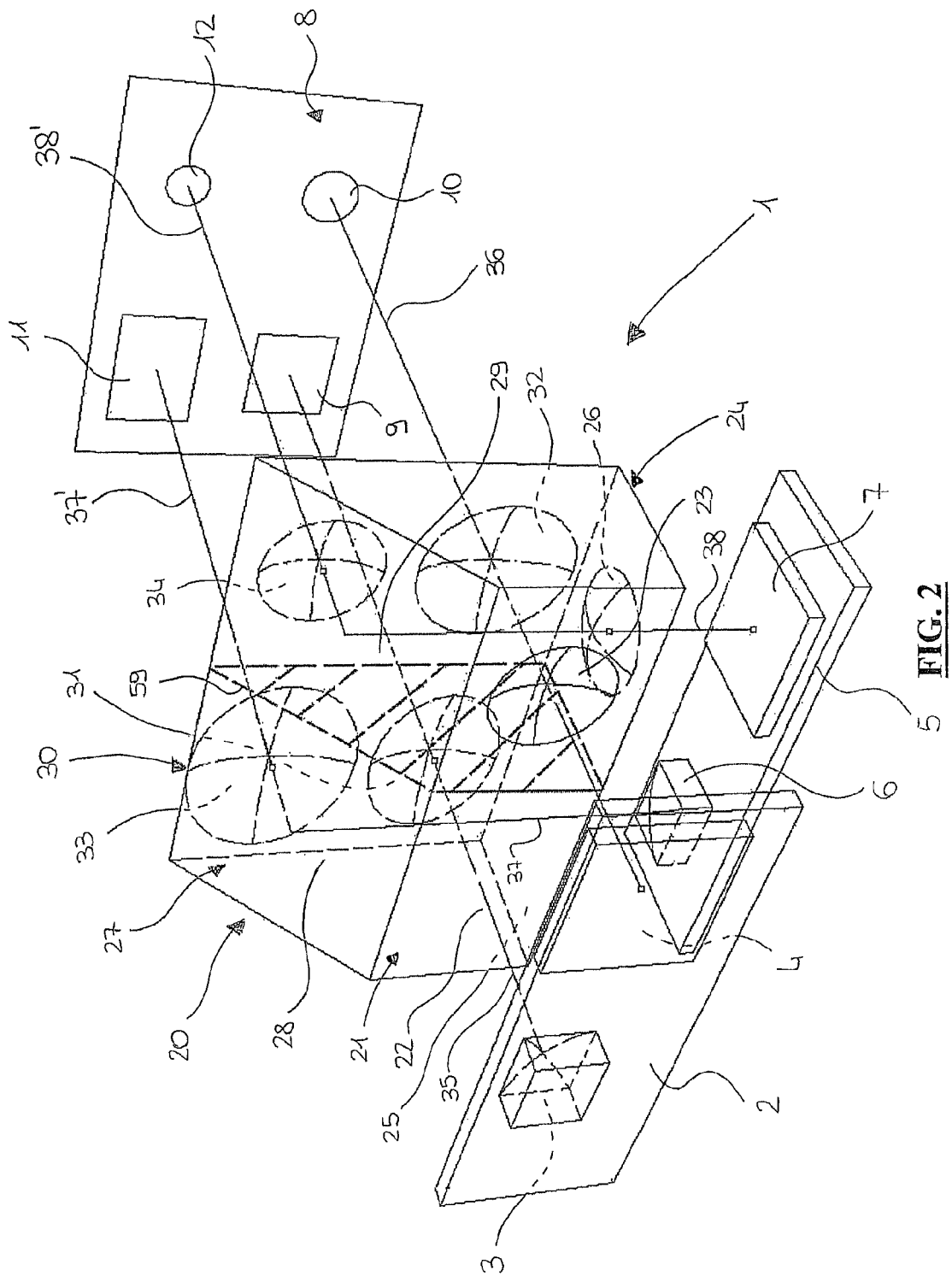

A first embodiment of an image acquisition device 1 and of an optical component 20 thereof is shown in FIGS. 1 and 2.

The image acquisition device 1 comprises, besides the optical component 20, a first printed circuit 2.

The first printed circuit 2 comprises a light emitter 3, like for example a light emitting diode (LED), a laser diode, a visible laser diode (VLD), a vertical cavity surface emission laser (VCSEL), a resonant cavity light emitting diode (RC-LED) or other suitable light sources.

The first printed circuit 2 further comprises a photodetector device or image sensor 4. The sensor 4 can be a one-dimensional or, preferably, a two-dimensional sensor. The sensor 4 is of the type suitable for detecting the light diffused by the area of which the image is to be acquired when it is illuminated by the radiation emitted by the emitter 3. The sensor 4 can for example be a CCD sensor, a C-MOS sensor, or other suitable photosensitive elements.

The image acquisition device 1 further comprises a second printed circuit 5.

The second printed circuit 5 also comprises a light emitter 6 and a photodetector device or image sensor 7, of the type suitable for detecting the light diffused by the area of which the image is to be acquired when it is illuminated by the radiation emitted by the emitter 6.

The first and/or second printed circuit(s) 2, 5 can also comprise (pre-)processing electronics of the acquired image, selected in a non-limiting way among filters and amplifiers, an analogue-to-digital converter, a transmission and/or reception component for external communication of the acquired image, a driver of a display device, one or more memories, etcetera. In the case of an optical code reader, there can also be a digitiser in the case of black and white codes, a decoder, and possibly further electronics dedicated to other functions.

The first and/or second printed circuit(s) 2, 5 preferably include(s) contact pads suitable for reflux soldering or for the positioning of conventional miniaturised ZIF ("Zero Insertion Force") connectors.

The image acquisition device 1 further comprises an apertured screen 8, better described hereinafter.

The optical component 20 is a monolithic transparent body. The optical component 20 is preferably made by moulding of a plastic material.

The optical component 20 is more specifically a right angle polyhedral body, with rectangular trapezoidal cross-section.

The angle of inclination of the oblique side is preferably 45°.

The minor base face 21 of the optical component 20 faces the first printed circuit 2 in the optical acquisition device 1.

Preferably, pins (not shown) for engaging in holes (not shown) of the first printed circuit 2 project from the minor base face 21 of the optical component 20, or there are other suitable means for ensuring the correct mutual positioning or alignment in the broadest sense between the components of the printed circuit 2 and the optical component 20, in particular its optically active regions described hereinafter.

The minor base face 21 of the optical component 20 comprises a first optically active region 22 and a second optically active region 23 that, in the acquisition device 1, are respectively optically associated with the emitter 3 and with the sensor 4 of the first printed circuit 2.

The first region 22 of the minor base face 21 is a surface configured to give the light emitted by the emitter 3 properties more suitable for the illumination of the area of which the image is to be acquired.

In other words, the first region 22 of the minor base face 21 is part of a first non-imaging lens.

In the present description and in the attached claims, under the expression "non-imaging lens" it is meant to indicate a lens in which there is not a one-to-one relationship between an object point and an image point, but rather any relationship such as one-to-many for some object points, one-to-one for other object points and many-to-one for yet other object points. Such lenses therefore do not create an image of the object in the photographic sense, but are suitable for example to shape the light of a light source according to a pattern suitable for the illumination of the area to be acquired.

In the present description and in the attached claims, under the expression "imaging lens", on the other hand, it is meant to indicate a lens in which there is a one-to-one relationship between an object point and an image point. Such lenses are suitable for the formation of an image so to say photographically on a sensor.

The first region 22 of the minor base face 21 is preferably a refractive surface of locally defined arbitrary shape, as described in EP 1 804 089 A1.

Alternatively, the first region 22 of the minor base face 21 can be a flat refractive surface or a diffractive surface.

The second region 23 of the minor base face 21 has the shape of a spherical refractive, aspherical refractive, toroidal refractive or diffractive surface, so as to embody a first surface of a first imaging lens.

The right angle side face 24 of the optical component 20 faces the second printed circuit 5 in the optical acquisition device 1.

Preferably, pins (not shown) for engaging in holes (not shown) of the second printed circuit 5 project from the right angle side face 24 of the optical component 20, or there are other suitable means for ensuring the correct mutual positioning or alignment in the broadest sense between the components of the printed circuit 5 and the optical component 20, in particular its optically active regions.

The right angle side face 24 of the optical component 20 comprises a first region 25 and a second region 26 that, in the acquisition device 1, are respectively optically associated with the emitter 6 and with the sensor 7 of the second printed circuit 5.

Similarly to the first region 22 of the minor base face 21, the first region 25 of the right angle side face 24 is a surface configured to give the light emitted by the emitter 6 properties more suitable for the illumination of the area of which the image is to be acquired.

In other words, the first region 25 of the right angle side face 24 is part of a second non-imaging lens.

The first region 25 of the right angle side face 24 is also preferably a refractive surface of locally defined arbitrary shape or, alternatively, it can be a flat refractive surface or a diffractive surface.

Similarly to the second region 23 of the minor base face 21, the second region 26 of the right angle side face 24 has the shape of a spherical refractive, aspherical refractive, toroidal refractive or diffractive surface, so as to embody a first surface of a second imaging lens.

The oblique side face 27 of the optical component 20 is configured like a deflection mirror, at least at two regions 28, 29 thereof optically associated with the regions 25, 26 of the right angle side face 24.

The oblique side face 27 can carry out the deflection mirror function through a mirror treatment of the transparent material of the optical component 20, the application of a mirror or of a reflective paint to the outside of the transparent material of the optical component 20, or through total internal reflection (TIR).

Alternatively or in addition, the oblique side face 27 could also have optically active regions of the type analogous to the other regions of the optical component 20, to carry out not just the deflection function, but also the function of surfaces of the imaging or non-imaging lenses.

The major base face 30 of the optical component 20 comprises, in its portion facing the minor base face 21, a first region 31 optically associated with the first region 22 of the minor base face 21 and with the emitter 3 of the first printed circuit 2, as well as a second region 32, optically associated with the second region 23 of the minor base face 21 and with the sensor 4 of the first printed circuit 2.

The major base face 30 of the optical component 20 further comprises, in its portion facing the oblique side face 27, a third region 33 optically associated with the first region 25 of the right angle side face 24 and with the emitter 6 of the second printed circuit 5, through the first region 28 of the oblique side face 27, as well as a fourth region 34, optically associated with the second region 26 of the right angle side face 24 and with the sensor 7 of the second printed circuit 5.

The first region 31 of the major base face 30 is a surface configured to give the light emitted by the emitter 3 properties more suitable for the illumination of the image to be acquired, in cooperation with the first region 22 of the minor base face 21.

The first region 31 of the major base face 30 is therefore part of the first non-imaging lens.

The first region 31 of the major base face 30 is also preferably a refractive surface of locally defined arbitrary shape or, alternatively, it can be a flat refractive surface or a diffractive surface.

The second region 32 of the major base face 30 has the shape of a spherical refractive, aspherical refractive, toroidal refractive or diffractive surface, so as to embody a second surface of the first imaging lens.

The third region 33 of the major base face 30 is a surface configured to give the light emitted by the emitter 6 properties more suitable for the illumination of the image to be acquired, in cooperation with the first region 25 of the right angle side face 24.

The third region 33 of the major base face 30 is therefore part of the second non-imaging lens.

The third region 33 of the major base face 30 is also preferably a refractive surface of locally defined arbitrary shape or, alternatively, it can be a flat refractive surface or a diffractive surface.

The fourth region 34 of the major base face 30 has the shape of a spherical refractive, aspherical refractive, toroidal refractive or diffractive surface, so as to embody a second surface of the second imaging lens.

In the optical acquisition device 1, the apertured screen 8 faces the major base surface 30 of the optical component 20.

Preferably, pins (not shown) for engaging in holes (not shown) of the apertured screen 8 project from the major base face 30 of the optical component 20, or there are other means suitable for ensuring the correct mutual positioning or alignment in the broadest sense between the screen and the optical component 20, in particular its optically active regions.

The apertured screen 8 could also be made of an opaque plastic material co-moulded with the transparent material or replaced by an light absorbing treatment of the major base face 30 or by painting it.

The apertured screen 8 comprises, in its portion corresponding to the minor base face 22, a first aperture 9 and a second aperture 10 and, in its region corresponding to the oblique side face 27, a third aperture 11 and a fourth aperture 12.

The first aperture 9 is optically associated with the first non-imaging lens comprising the first region 22 of the minor base face 21 and the first region 31 of the major base face 30, as well as with the emitter 3 of the first printed circuit 2, and it is configured to screen (baffle aperture) from possible reflections and to select the emission cone of the emitter 3 associated with such a first non-imaging lens.

The second aperture 10 is optically associated with the first imaging lens comprising the second region 23 of the minor base face 21 and the second region 32 of the major base face 30, as well as with the sensor 4 of the first printed circuit 2, and it is configured to embody an aperture stop of such a first imaging lens.

The third aperture 11 is optically associated with the second non-imaging lens comprising the first region 25 of the right angle side face 24 and the third region 33 of the major base face 30, as well as with the emitter 6 of the second printed circuit 5, and it is configured to screen (baffle aperture) from possible reflections and to select the emission cone of the emitter 6.

The fourth aperture 12 is optically associated with the second imaging lens comprising the second region 26 of the right angle side face 24 and the fourth region 34 of the major base face 30, as well as with the sensor 7 of the second printed circuit 5, and it is configured to embody an aperture stop of such a second imaging lens.

The apertured screen 8 could however be left out.

Thanks to the optical association, the light beam emitted by the emitter 3 is conveyed from the first region 22 of the minor base face 21 to the first region 31 of the major base face 30, possibly undergoing the suitable changes in characteristics such as shape and local intensity. Purely for indicative purposes, the overall progression of the light beam is shown with reference numeral 35.

Moreover, thanks to the optical association, the light beam diffused by the illuminated area is conveyed from the second region 32 of the major base face 30 to the second region 23 of the minor base face 21, and then to the sensor 4 of the first printed circuit 2, undergoing the suitable changes in direction suitable for the formation of an image on the sensor 4. Purely for indicative purposes, the overall progression of the light beam is shown with reference numeral 36.

It should be noted that the overall progression 35 of the first illumination light beam and the overall progression 36 of the first imaging light beam are parallel.

By suitably configuring the aforementioned regions 22, 31; 23, 32, the emitter 3 and the sensor 4 of the first printed circuit 2, and the apertures 9, 10 of the apertured screen 8, it is therefore possible to make, in the image acquisition device 1, a first subsystem having a first acquisition configuration.

Similarly, thanks to the optical association, the light beam emitted by the emitter 6 of the second printed circuit 2 is conveyed from the first region 25 of the right angle side face 24 to the third region 33 of the major base face 30, possibly undergoing the suitable changes in characteristics such as shape and local intensity. Purely for indicative purposes, the overall progression of the light beam is shown with reference numeral 37, 37'.

Moreover, thanks to the optical association, the light beam diffused by the illuminated area is conveyed from the fourth region 34 of the major base face 30 to the second region 26 of the right angle side face 24, and then to the sensor 7 of the second printed circuit 5, undergoing the suitable changes in direction suitable for the formation of an image on the sensor 4. Purely for indicative purposes, the overall progression of the light beam is shown with reference numeral 38, 38'.

It should be noted that the overall progression 37, 37' of the second illumination light beam and the overall progression 38, 38' of the second imaging light beam are parallel.

By suitably configuring the aforementioned regions 25, 33; 26, 34, the emitter 6 and the sensor 7 of the second printed circuit 5 and the apertures 11, 12 of the apertured screen 8, in the image acquisition device 1, a second subsystem having a second acquisition configuration can therefore be made.

It should be noted that, thanks to the different orientation between the faces of the optical component 20, in particular thanks to the orientation at 90° between the minor base face 21 and the right angle side face 24, the overall progressions 35 and 37, 37' of the light beams associated with the homologous illumination functions according to the two different configurations intersect, in particular at 90° in portions 35 and 37, as well as the overall progressions 36 and 38, 38' of the light beams associated with the homologous imaging functions according to the two different configurations intersect, in particular at 90° in portions 36 and 38.

Under orientation between the faces of the optical component 20 it is meant to indicate the orientation between the normals to reference planes defined by the faces. Under reference plane defined by a face, a plane corresponding to the overall progression of the face is meant. In particular, the reference plane can be defined by one or more flat portions of the face that act as a frame or as a support for the optically active regions contained in it. In the figures, the normals to the reference planes defined by the faces 21, 24 and 30 are identifiable in the portions of the overall progressions of the light beams 35 and 36; 37 and 38; and 37', 38', respectively. From a practical embodiment point of view, the reference plane is a real or virtual plane that acts as a reference for the correct positioning of the component with respect to the mechanical and optoelectronic components associated with it.

Inside the optical component 20 there can be a screen 59 between the regions assigned to the illumination function (overall progressions 35 and 37, 37') on one side, and the regions assigned to the imaging function (overall progressions 36 and 38, 38') on the other.

Such a screen 59 can for example consist of an opaque inner wall should the body of the transparent optical component 20 be hollow, or of an opaque plastic material co-moulded with the transparent material to make a solid optical component 20.

Alternatively or in addition to the inner screen 59, there can be screens for the trapezoidal faces of the optical component 20, for rejecting ambient light.

Just as an example, the first subsystem of the image acquisition device 1 can provide an optimised configuration for close-up acquisition, while the second subsystem can provide an optimised configuration for long-distance acquisition; the first subsystem can provide an optimised configuration for the acquisition of black and white optical codes, while the second subsystem can provide an optimised configuration for the acquisition of colour optical codes; the first subsystem can provide an optimised configuration for a first wavelength, while the second can provide an optimised configuration for a second wavelength; etcetera.

It should be emphasised that in the various cases, it is possible to configure the image acquisition device 1 so that in each acquisition subsystem the field of view of the illumination section can coincide with the field of view of the receiving section, or can be superimposed over it completely at least at one distance, and at least partially at the other distances.

The subsystems can be used simultaneously, alternatively or alternately.

It is noted that simultaneous use is not precluded by the intersection of the light beams, in particular since it is possible to use different wavelengths and/or design overall progressions of the individual light rays so as to avoid interference, thanks also to the exploitation of the refractive surfaces of locally defined arbitrary shape.

In the case of simultaneous use, both of the acquisition subsystems will provide images to be processed to a processor of the image acquisition device 1 itself or external thereto, which can process them in parallel or individually.

In the case of alternative use, in the image acquisition device 1 just one of the two printed circuits 2, 5 can be assembled, according to the predetermined configuration, with manifest advantages in terms of production of parts and of storage.

In the case of alternate use, cyclic drive electronics can for example be provided for, which provides for switching on the emitter 3 and the sensor 4 of the first printed circuit 2 in a first half-cycle and the emitter 6 and the sensor 7 of the second printed circuit 5 in a second half-cycle.

Furthermore, manual or automatic selection of the acquisition configuration to be used can be provided, for example based upon the distance of the image to be acquired, upon the type of optical code to be acquired or based upon the outcome of the acquisition, namely trying to decode with a first configuration and trying to decode again with the other configuration if the decoding attempt is unsuccessful.

Advantageously, the drive electronics is associated with at least one detector of the acquisition condition, preferably with a distance measurement system integrated in the image acquisition device 1, and even more preferably with an optoelectronic distance measurement system the optical part of which is integrated in the optical component 20 itself, as further discussed hereinafter.

In the particularly interesting case of optimised configurations for acquisition from a different distance, the optical acquisition device 1 can therefore include an autofocus function.

The image acquisition device 1 is extremely compact and light. The image acquisition device 1 is therefore particularly suitable for being housed in a portable, hand-held or wearable, e.g. wrist- or finger-wearable casing, or integrated in an even complex image acquisition and processing system wherein the dimensional restrictions are particularly stringent.

Moreover, operations for assembling the image acquisition device 1 are quick and simple thanks to the low number of components to be mounted, in particular to the absence of many optical components to be positioned in the desired mutual geometric relationship, as well as thanks to the provision of coupling pins and holes, which determine the automatic positioning of the elements of the image acquisition device 1 in the desired geometric relationship, in particular their alignment.

It should be understood that it is possible to extend the optical acquisition device 1 increasing the number of optically active regions of the various faces of the optical component 20, and arranging further optoelectronic components on the printed circuits 2, 5. For example, it is possible to provide for a double illumination associated with each sensor, or two sensors with different properties associated having a common illumination, or to make any number of acquisition subsystems.

The optically active regions of the various faces of the optical component 20 could also be assigned only to two or more illumination functions, or only to two or more imaging functions, for example to make an illumination section or a receiving section, respectively, of an optical code reader or another image acquisition device. In this case, of course on each printed circuit 2, 5 there shall be only one or more emitters or one or more sensors, respectively.

It is also possible, alternatively or in addition to the illumination and/or imaging functions, to integrate other optoelectronic functions in the optical component 20 and in the image acquisition device 1, respectively, by providing suitable regions of the faces of the optical component 20 and suitable optoelectronic components suitable for being optically associated with them.

Amongst the optoelectronic functions that can be carried out the following are mentioned merely by way of an example: the projection of a luminous aiming figure, the projection of a luminous outcome figure, optoelectronic presence detection, optoelectronic distance measurement, in particular through triangulation, information reception and/or transmission.

For example, distance measurement can be carried out through coupling a high frequency modulating emitter (40-100 MHz) with a quick-response sensor combined with a demodulation circuit that calculates the phase shift between output signal and input signal, as described in EP 1 074 854 A1 and EP 652 530 B1, or through an optical time-of-flight measurement system, or through an optical triangulation system. The optically active regions can comprise spherical refractive surfaces, aspherical refractive surfaces, toroidal refractive surfaces, diffractive surfaces.

The presence/absence detection can be carried out through a sensor of the PSD (Position Sensitive Device) type coupled with a suitable emitter, or through an optical system consisting of an emitter/receiver pair whose fields of view only cross near to a predetermined detection distance, or in one of the many ways known in the art. The optically active regions can comprise spherical refractive surfaces, aspherical refractive surfaces, toroidal refractive surfaces, diffractive surfaces.

The information transmission and/or reception can also be carried out through an optical emitter/receiver pair in one the many ways known in the art. The optically active regions can comprise spherical refractive surfaces, aspherical refractive surfaces, toroidal refractive surfaces, flat refractive surfaces, diffractive surfaces.

Figure 3:
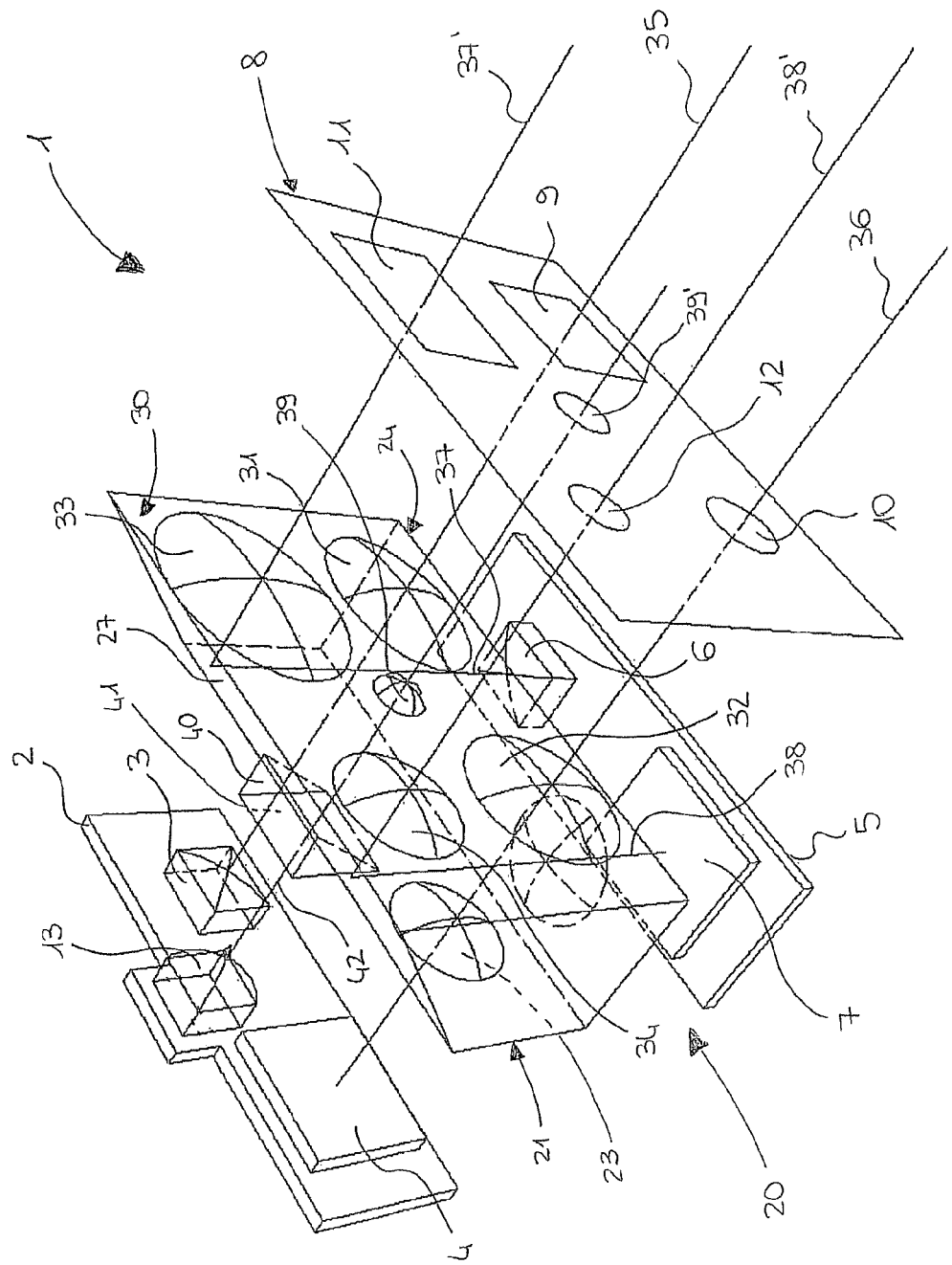
FIG. 3 illustrates the optical device of FIGS. 1 and 2 with a modification of the optical component and of a printed circuit.

By way an example of projection of a luminous aiming or outcome indication figure, FIG. 3 illustrates the optical device 1, wherein on the major base face 30 of the optical component 20 a central region 39 between the four optically active regions 31, 32, 33 and 34 is made.

The optical component 20 has a protrusion 40 centrally at the end of the minor base face 21, on which a further optically active region 41 can be made, optically associated with the central region 39 of the major base face 30.

On the first printed circuit 2 there is a further light emitter 13, arranged in a central position translated with respect to the emitter 3 and to the sensor 4, so as to be optically associated with the further region 41 of the protrusion 40 and with the central region 39 of the major base face 30.

Thanks to the optical association, the light beam emitted by the further emitter 13 is conveyed from the further region 41 of the protrusion 40 of the minor base face 21 to the central region 39 of the major base face 30, possibly undergoing the suitable changes in characteristics such as shape and local intensity. Purely for indicative purposes, the overall progression of the light beam is shown with reference numeral 42.

The further region 41 of the protrusion 40 and the central region 39 of the major base face 30 can be configured to shape and/or focus the beam of light emitted by the further emitter 13, so as to give the beam a shape suitable for identifying a central part and/or the corners and/or the edges of the fields of view of the two optical acquisition configurations of the image acquisition device 1, or so as to give the beam a shape and/or a colour suitable for indicating the outcome of the acquisition of an image, for example successful reading of an optical code or failed reading, possibly also indicating the presumed reasons for the error.

For example, one or the other region 39, 41 can be flat refractive surfaces, refractive surfaces of locally defined arbitrary shape, diffractive surfaces, or polyhedral surfaces, for example a pyramid as described in patent EP 1 172 756 B1.

The surface 41 can also be a spherical refractive surface or an aspherical refractive surface.

The apertured screen 8, if present, shall comprise a suitable aperture 39' optically associated with the further emitter 13, with the further region 41 of the protrusion 40 and with the central region 39 of the major base face 30.

Figure 4:
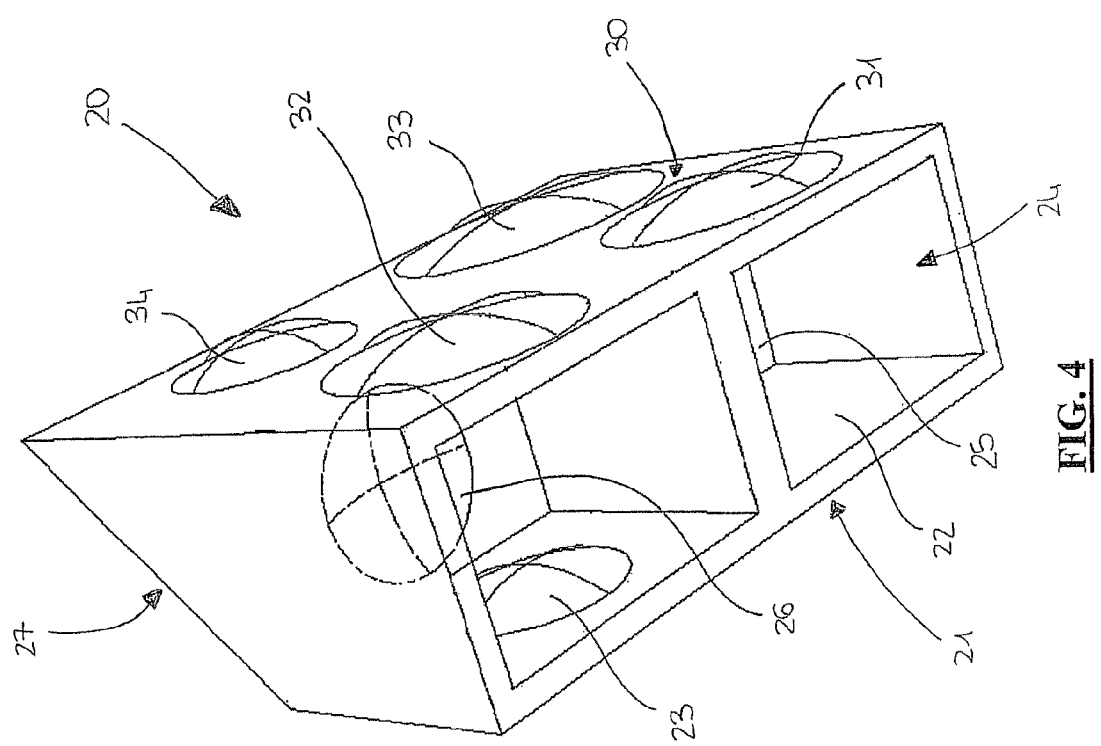
FIG. 4 illustrates an optical component modified with respect to FIGS. 1 and 2.

FIG. 4 illustrates an optical component 20 modified with respect to FIGS. 1 and 2 in that the optically active regions 25, 26 of the right angle side face 24 are recessed into the optical component 20.

This provision, which can equally be applied to the other optically active regions, in particular to the second region 23 of the minor base face 21, assigned to the imaging function, makes it possible to reduce the distance from the third and from the fourth regions 33, 34 of the major base face 30, and introduces a free air propagation portion, which gives an additional degree of freedom of design. Moreover, space is left available for components projecting from the second printed circuit 5, for which reason the overall size of the optical image acquisition device 1 can be reduced.

Figure 5:
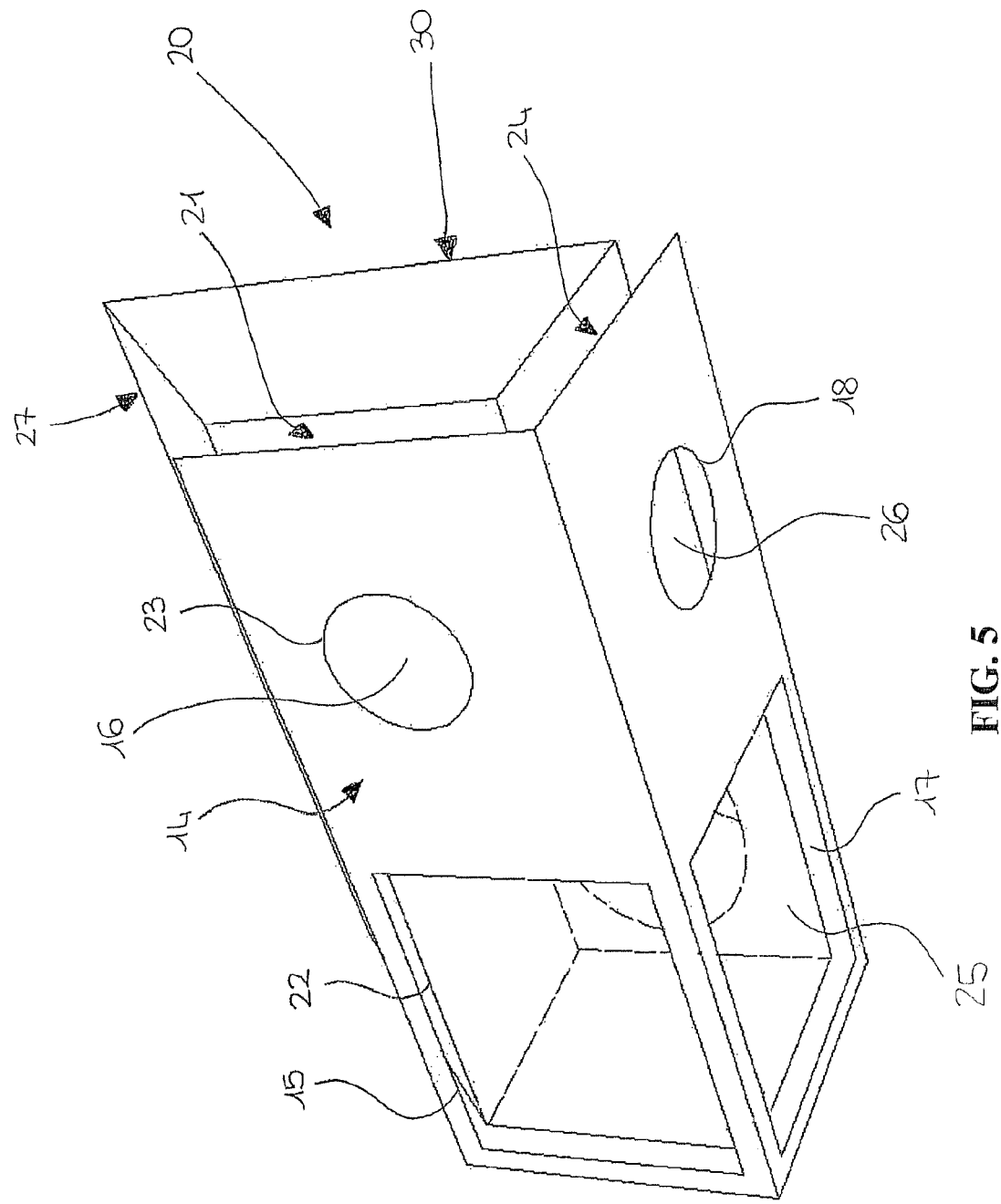
FIG. 5 illustrates in part the optical device of FIGS. 1 and 2 with a modification of a screen thereof.

FIG. 5 illustrates an apertured screen 14 as an alternative or in addition to the apertured screen 8, coupled with the optical component 20. The apertured screen 14 is bent into an L-shape and faces the minor base face 21 and the right angle side face 24 of the optical component 20, and has apertures 15, 16, 17, 18 optically associated with their optically active regions 22, 23, 25, 26, respectively, carrying out the functions of baffle apertures of the non-imaging lenses and of aperture stop of the imaging lenses.

It should be understood that one part only of the apertured screen 14, for example one wing only of the L-shape, could analogously be provided for, alternatively or in addition to the apertured screen 8.

Preferably, also in the case of use of an apertured screen 14 arranged between the printed circuit 2 and/or 5 and the optical component 20, there shall be pins and corresponding holes or other means for ensuring the correct mutual positioning or alignment in the broadest sense between the optical component 20, the screen 14, and the optoelectronic components of the printed circuit 5.

Figure 6:
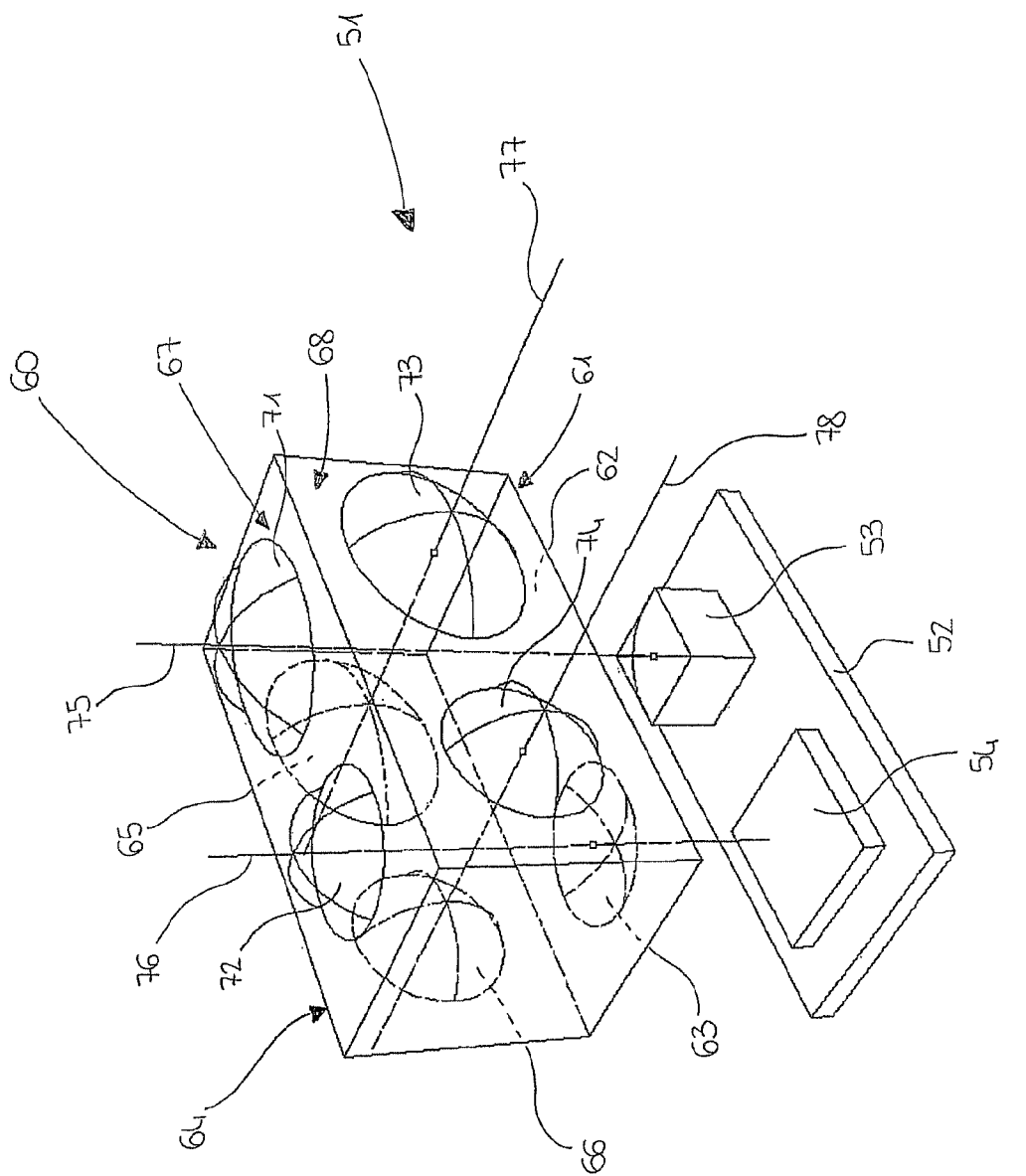
FIG. 6 illustrates a second embodiment of an image acquisition device and of an optical component thereof.

A second embodiment of an image acquisition device 51 and of an optical component 60 thereof is shown in FIG. 6.

The image acquisition device 51 comprises, besides the optical component 60, a single printed circuit 52, comprising a light emitter 53 and a photodetector device or image sensor 54.

For the details and the possible additional components of the printed circuit 52, reference is fully made to the description of the printed circuits 2, 5 of the first embodiment described above.

The optical component 60 is a monolithic transparent body. The optical component 60 is preferably made by moulding of a plastic material.

The optical component 60 is more specifically a right angle polyhedral body, having a square cross-section, which could however also have a rectangular cross-section.

A first face 61 of the optical component 60 can face, in a first acquisition configuration of the optical acquisition device 51, the printed circuit 52.

Preferably, pins (not shown) for engaging in holes (not shown) of the printed circuit 52 project from the first face 61 of the optical component 60, or there are other suitable means for ensuring the correct mutual positioning or alignment in the broadest sense between the components of the printed circuit 52 and the optical component 60, in particular its optically active regions described hereinafter.

The first face 61 of the optical component 60 comprises a first optically active region 62 and a second optically active region 63 that, in the first acquisition configuration of the acquisition device 51, are respectively optically associated with the emitter 53 and with the sensor 54 of the printed circuit 52.

The first region 62 of the first face 61 is a surface configured to give the light emitted by the emitter 53 properties more suitable for the illumination of the image to be acquired.

In other words, the first region 62 of the first face 61 is part of a first non-imaging lens.

The first region 62 of the first face 61 is preferably a refractive surface of locally defined arbitrary shape, but alternatively it can be a flat refractive surface or a diffractive surface.

The second region 63 of the first face 61 has the shape of a spherical refractive, aspherical refractive, toroidal refractive or diffractive surface, so as to embody a first surface of a first imaging lens.

A second face 64 of the optical component 60, adjacent to the first face 61, can face, in a second acquisition configuration of the optical acquisition device 51 obtained by rotation by 90° of the optical component 60, the printed circuit 52.

Preferably, pins (not shown) for engaging in holes (not shown) of the printed circuit 52 project from the second face 64 of the optical component 60, or there are other suitable means for ensuring the correct mutual positioning or alignment in the broadest sense between the components of the printed circuit 52 and the optical component 60.

The second face 64 of the optical component 60 comprises a first region 65 and a second region 66 that, in the second acquisition configuration of the acquisition device 51, are respectively optically associated with the emitter 53 and with the sensor 54 of the printed circuit 52.

Similarly to the first region 62 of the first face 61, the first region 65 of the second face 64 is a surface configured to give the light emitted by the emitter 53 properties more suitable for the illumination of the image to be acquired.

In other words, the first region 65 of the second face 64 is part of a second non-imaging lens.

The first region 65 of the second face 64 is also preferably a refractive surface of locally defined arbitrary shape or, alternatively, it can be a flat refractive surface or a diffractive surface.

Similarly to the second region 63 of the first face 61, the second region 66 of the second face 64 has the shape of a spherical refractive, aspherical refractive, toroidal refractive or diffractive surface, to embody a first surface of a second imaging lens.

A third face 67 of the optical component 60, opposite the first face 61, comprises a first region 71 optically associated with the first region 62 of the first face 61 and, in the first acquisition configuration of the image acquisition device 51, with the emitter 53 of the printed circuit 52, as well as a second region 72, optically associated with the second region 63 of the first face 61 and, in the first acquisition configuration of the image acquisition device 51, with the sensor 54 of the printed circuit 52.

The first region 71 of the third face 67 is a surface configured to give the light emitted by the emitter 53 properties more suitable for the illumination of the image to be acquired, in cooperation with the first region 62 of the first face 61.

The first region 71 of the third face 67 is therefore part of the first non-imaging lens.

The first region 71 of the third face 67 is also preferably a refractive surface of locally defined arbitrary shape or, alternatively, it can be a flat refractive surface or a diffractive surface.

The second region 72 of the third face 67 has the shape of a spherical refractive, aspherical refractive, toroidal refractive or diffractive surface, to embody a second surface of the first imaging lens.

A fourth face 68 of the optical component 60, opposite the second face 64, comprises a first region 73 optically associated with the first region 65 of the second face 64 and, in the second acquisition configuration of the image acquisition device 51, with the emitter 53 of the printed circuit 52, as well as a second region 74, optically associated with the second region 66 of the second face 64 and, in the second acquisition configuration of the image acquisition device 51, with the sensor 54 of the printed circuit 52.

The first region 73 of the fourth face 68 is a surface configured to give the light emitted by the emitter 53 properties more suitable for the illumination of the image to be acquired, in cooperation with the first region 65 of the second face 64.

The first region 73 of the fourth face 68 is therefore part of the second non-imaging lens.

The first region 73 of the fourth face 68 is also preferably a refractive surface of locally defined arbitrary shape or, alternatively, it can be a flat refractive surface or a diffractive surface.

The second region 74 of the fourth face 68 has the shape of a spherical refractive, aspherical refractive, toroidal refractive or diffractive surface, so as to embody a second surface of the second imaging lens.

The image acquisition device 51 can further comprise an apertured screen (not shown) analogous to the apertured screen 8 or 14 of the first embodiment described above, arranged at one or more faces of the optical component 60, and preferably coupled with it through pins and holes or other suitable means, or made of an opaque plastic material co-moulded with the transparent material or through an light absorbing treatment or by painting the face(s) 61, 64, 67, 68 of the optical component 60.

If present, such an apertured screen shall comprise, in one or more of its regions facing first regions 62, 65, 71, 73 of the various faces 61, 64, 67, 68, one or more apertures optically associated with the non-imaging lens(es) and configured to embody one or more baffle aperture(s) of such non-imaging lens(es), as well as, in one or more of its regions facing second regions 63, 66, 72, 74 of the various faces 61, 64, 67, 68, one or more apertures optically associated with the imaging lens(es) and configured to embody one or more aperture stop(s) of such imaging lens(es).

Thanks to the optical association, the light beam emitted by the emitter 53 in the first acquisition configuration of the image acquisition device 51 is conveyed from the first region 62 of the first face 61 to the first region 71 of the third face 67, possibly undergoing the suitable changes in characteristics such as shape and local intensity.

Purely for indicative purposes, the overall progression of the light beam is shown with reference numeral 75.

Moreover, thanks to the optical association, the light beam diffused by the illuminated area is conveyed from the second region 72 of the third face 67 to the second region 63 of the first face 61 and then, in the first acquisition configuration of the image acquisition device 51, to the sensor 54 of the printed circuit 52, undergoing the suitable changes in direction suitable for the formation of an image on the sensor. Purely for indicative purposes, the overall progression of the light beam is shown with reference numeral 76.

It should be noted that the overall progression 75 of the first illumination light beam and the overall progression 76 of the first imaging light beam are parallel.

By suitably configuring the aforementioned regions 62, 71; 63, 72 and the possible associated apertures in the apertured screen, it is possible to give the desired characteristics to the first acquisition configuration of the image acquisition device 51.

Thanks to the optical association, the light beam emitted by the emitter 53 is conveyed from the first region 65 of the second face 64 to the first region 73 of the fourth face 68, possibly undergoing the suitable changes in characteristics such as shape and local intensity. Purely for indicative purposes, the overall progression of the light beam is shown with reference numeral 77.

Moreover, thanks to the optical association, the light beam diffused by the illuminated area is conveyed from the second region 74 of the fourth face 68 to the second region of the second face 64, and then to the sensor 54, undergoing the suitable changes in direction suitable for the formation of an image on the sensor 54. Purely for indicative purposes, the overall progression of the light beam is shown with reference numeral 78.

It should be noted that the overall progression 77 of the second illumination light beam and the overall progression 78 of the second imaging light beam are parallel.

By suitably configuring the aforementioned regions 65, 73; 66, 74, and the possible associated apertures in the apertured screen, it is possible to give the desired characteristics to the second acquisition configuration of the image acquisition device 51.

It should be noted that, thanks to the different orientation between the faces of the optical component 60, in particular thanks to the orientation at 90° between the first face 61 and the second face 64, the overall progressions 75 and 77 of the light beams associated with the homologous illumination functions according to the two different configurations intersect, in particular at 90°, as well as the overall progressions 76 and 78 of the light beams associated with the homologous imaging functions according to the two different configurations intersect, in particular at 90°.

Inside the optical component 60 there can be a screen (not shown) analogous to the screen 59 of the first embodiment, between the regions assigned to the illumination function (overall progressions 75 and 77) on the one side, and the regions assigned to the imaging function (overall progressions 76 and 78) on the other.

Such a screen can for example consist of an opaque inner wall should the body of the transparent optical component 60 be hollow, or of an opaque plastic material co-moulded with the transparent material to make a solid optical component 60.

Alternatively or in addition to the inner screen, there can be screens of the side faces of the optical component 60, for rejecting light from the outside.

As far as the characteristics of the two acquisition configurations are concerned, reference is fully made to what has been described with reference to the subsystems of the image acquisition device 1 of the first embodiment.

The selection of the acquisition configuration of the image acquisition device 51 can take place only once in the assembly step upon leaving the factory, or in the installation step according to the predetermined configuration, with clear advantages in terms of production of parts and of storage.

The acquisition configuration of the image acquisition device 51 can however also be changed after installation, by providing for suitable coupling means replacing the pins and holes described above, and by providing for a suitable rotation mechanism of the optical component 60.

The rotation mechanism of the optical component 60 can also be automated, by providing for drive electronics, for example based upon the distance of the image to be acquired or the type of optical code to be acquired.

The image acquisition device 51 has the advantages outlined above with reference to the image acquisition device 1 of the first embodiment.

Moreover, it is possible to extend or diversify the functions of the image acquisition device 51 by increasing the number of optically active regions of the various faces of the optical component 60, and by arranging further optoelectronic components on the printed circuit 52, or to use it as an illumination section, as an receiving section, as a projection section of a luminous aiming or outcome indication figure, as a distance measurement section, as a presence detection section, or as an information transmission and/or reception section, in a way totally analogous to what has been described with reference to the first embodiment.

It is also possible to make any number of acquisition configurations by shaping the optical component with a polygonal section having any even number of sides, i.e. hexagonal, octagonal etc. The acquisition configuration shall be selected through rotation of the optical component by a suitable angle. The optically active regions of opposite faces of the optical component shall be optically associated. The optically active regions associated with homologous optical functions, but according to different configurations, shall define overall progressions of light beams intersected at a certain angle defined by the relative orientation of said pairs of opposite faces.

Figure 7:
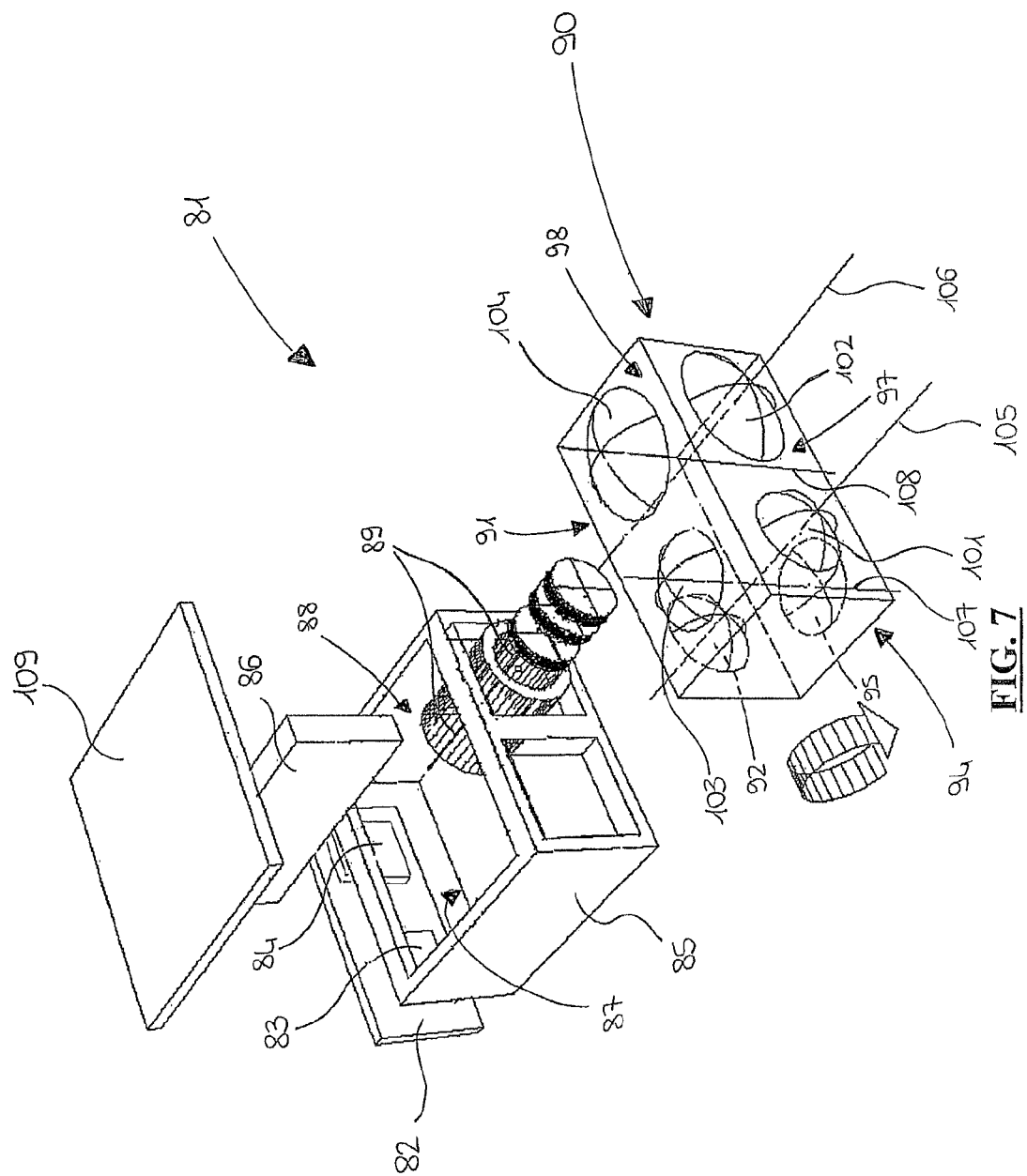
FIG. 7 illustrates a third embodiment of an image acquisition device and of an optical component thereof.
Figure 8:
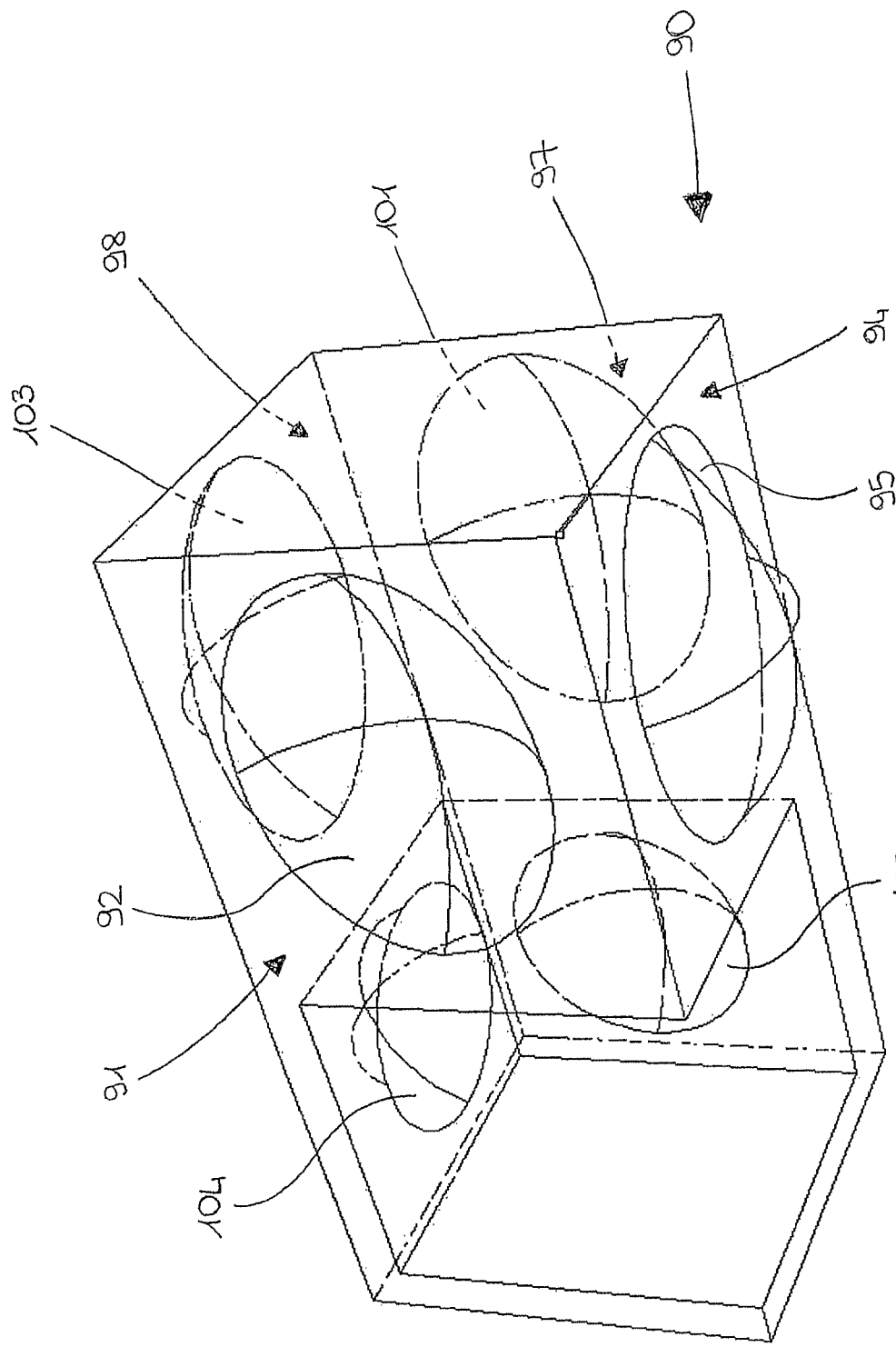
FIG. 8 illustrates the optical component of FIG. 7.

A third embodiment of an image acquisition device 81 and of an optical component 90 thereof is shown in FIGS. 7 and 8.

The image acquisition device 81 comprises, besides the optical component 90, a single printed circuit 82, comprising a light emitter 83 and a photodetector device or image sensor 84.

For the details and the possible additional components of the printed circuit 82, reference is fully made to the description of the printed circuits 2, 5 of the first embodiment described above.

The image acquisition device 81 further comprises a support framework 85 of the optical component 90 as well as of other components of the device 81.

The framework 85 has an overall right angle polyhedral shape with rectangular cross-section, having at least three consecutive substantially open faces.

The printed circuit 82 is fixed to the framework 85 at one of the substantially open faces.

The image acquisition device 81 further comprises, preferably but not necessarily, a diaphragm 86 housed in the space inside the framework 85, to divide the space inside the framework 85 into a first chamber 87 in front of the emitter 83 of the printed circuit 82, and a second chamber 88 in front of the sensor 84 of the printed circuit 82.

The image acquisition device 81 further comprises, preferably but not necessarily, an imaging lens 89 housed in the second chamber 88.

The imaging lens 89 preferably consists of a barrel that encloses a group of lenses.

The optical component 90 is a monolithic transparent body. The optical component 90 is preferably made by moulding of a plastic material.

The optical component 90 is more specifically a substantially right angle polyhedral shaped body with square cross-section, but partially hollow to house the imaging lens 89 within it. The section of the right angle polyhedron could however also be rectangular.

A first face 91 of the optical component 90 can face, in a first acquisition configuration of the optical acquisition device 81, the printed circuit 82.

The first face 91 of the optical component 90 comprises only a first region 92 that, in the first acquisition configuration of the acquisition device 81, is optically associated with the emitter 83 of the printed circuit 82, while at the sensor 84 of the printed circuit 82, the first face 91 is hollow.

The first region 92 of the first face 91 is a surface configured to give the light emitted by the emitter 83 properties more suitable for the illumination of the image to be acquired.

In other words, the first region 92 of the first face 91 is part of a first non-imaging lens.

The first region 92 of the first face 91 is preferably a refractive surface of locally defined arbitrary shape, but alternatively it can be a flat refractive surface or a diffractive surface.

A second face 94 of the optical component 90, adjacent to the first face 91, can face, in a second acquisition configuration of the optical acquisition device 81 obtained by rotation by 90° of the optical component 90, the printed circuit 82.

The second face 94 of the optical component 90 also comprises only a first region 95 that, in the second acquisition configuration of the acquisition device 81, is optically associated with the emitter 83 of the printed circuit 82, while at the sensor 84 of the printed circuit 82, the optical component 90 lacks the second face 94.

Similarly to the first region 92 of the first face 91, the first region 95 of the second face 94 is a surface configured to give the light emitted by the emitter 83 properties more suitable for the illumination of the image to be acquired.

In other words, the first region 95 of the second face 94 is part of a second non-imaging lens.

The first region 95 of the second face 94 is also preferably a refractive surface of locally defined arbitrary shape, but alternatively it can be a flat refractive surface or a diffractive surface.

A third face 97 of the optical component 90, opposite the first face 91, comprises a first region 101 optically associated with the first region 92 of the first face 91 and, in the first acquisition configuration of the image acquisition device 81, with the emitter 83 of the printed circuit 82, as well as a second region 102, optically associated, in the first acquisition configuration of the image acquisition device 81, with the sensor 84 of the printed circuit 82 and with the imaging lens 89, where provided for.

The first region 101 of the third face 97 is a surface configured to give the light emitted by the emitter 83 properties more suitable for the illumination of the image to be acquired, in cooperation with the first region 92 of the first face 91.

The first region 101 of the third face 97 is therefore part of the first non-imaging lens.

The first region 101 of the third face 97 is also preferably a refractive surface of locally defined arbitrary shape or, alternatively, it can be a flat refractive surface or a diffractive surface.

The second region 102 of the third face 97 can be flat or have the shape of a spherical refractive, aspherical refractive, toroidal refractive or diffractive surface, so as to embody a further surface of the imaging lens 89 in the first acquisition configuration of the image acquisition device 81.

A fourth face 98 of the optical component 90, opposite the second face 94, comprises a first region 103 optically associated with the first region 95 of the second face 94 and, in the second acquisition configuration of the image acquisition device 81, with the emitter 83 of the printed circuit 82, as well as a second region 104, optically associated, in the second acquisition configuration of the image acquisition device 81, with the sensor 84 of the printed circuit 82 and with the imaging lens 89, where provided for.

The first region 103 of the fourth face 98 is a surface configured to give the light emitted by the emitter 83 properties more suitable for the illumination of the image to be acquired, in cooperation with the first region 95 of the second face 94.

The first region 103 of the fourth face 98 is therefore part of the second non-imaging lens.

The first region 103 of the fourth face 98 is also preferably a refractive surface of locally defined arbitrary shape or, alternatively, it can be a flat refractive surface or a diffractive surface.

The second region 104 of the fourth face 98 can be flat or have the shape of a spherical refractive, aspherical refractive, toroidal refractive or diffractive surface, so as to embody a further surface of the imaging lens 87 in the second acquisition configuration of the image acquisition device 81.

The image acquisition device 81 can further comprise an apertured screen (not shown) analogous to the apertured screen 8 or 14 of the first embodiment described above, arranged at one or more faces of the optical component 90, and preferably coupled thereto through pins and holes or other suitable means, or made of an opaque plastic material co-moulded with the transparent material or through an light absorbing treatment or by painting the face(s) 91, 94, 97, 98 of the optical component 90.

If present, such an apertured screen shall comprise, in one or more regions thereof facing first regions 92, 95, 101, 103 of the various faces 91, 94, 97, 98, one or more aperture(s) optically associated with the non-imaging lens(es) and configured to embody one or more baffle aperture(s) of such non-imaging lens(es), as well as, in one or more regions thereof facing the second regions 102, 104 of the faces 97, 98, one or more aperture(s) optically associated with the imaging lens(es) and configured to embody one or more aperture stop(s) of such imaging lens(es).

Thanks to the optical association, the light beam emitted by the emitter 83 in the first acquisition configuration of the image acquisition device 81 is conveyed from the first region 92 of the first face 91 to the first region 101 of the third face 97, possibly undergoing the suitable changes in characteristics such as shape and local intensity. Purely for indicative purposes, the overall progression of the light beam is shown with reference numeral 105.

Thanks to the optical association, the light beam diffused by the illuminated area is conveyed through the second region 102 of the third face 97 and then, in the first acquisition configuration of the image acquisition device 81, to the sensor 84 of the printed circuit 82, undergoing the suitable changes in direction suitable for the formation of an image on the sensor. Purely for indicative purposes, the overall progression of the light beam is shown with reference numeral 106.

It should be noted that the overall progression 105 of the first illumination light beam and the overall progression 106 of the first imaging light beam are parallel.

By suitably configuring the aforementioned regions 92, 101 and 102 and the possible associated apertures in the aperturerd screen, it is possible to give the desired characteristics to the first acquisition configuration of the image acquisition device 81.

Thanks to the optical association, the light beam emitted by the emitter 83 is conveyed from the first region 95 of the second face 94 to the first region 103 of the fourth face 98, possibly undergoing the suitable changes in characteristics such as shape and local intensity. Purely for indicative purposes, the overall progression of the light beam is shown with reference numeral 107.

Moreover, thanks to the optical association, the light beam diffused by the illuminated area is conveyed from the second region 104 of the fourth face 98 and then to the sensor 84, undergoing the suitable changes in direction suitable for the formation of an image on the sensor. Purely for indicative purposes, the overall progression of the light beam is shown with reference numeral 108.

It should be noted that the overall progression 107 of the second illumination light beam and the overall progression 108 of the second imaging light beam are parallel.

By suitably configuring the aforementioned regions 95, 103 and 104, and the possible associated apertures in the aperturerd screen, it is possible to give the desired characteristics to the second acquisition configuration of the image acquisition device 81.

It should be noted that, thanks to the different orientation between the faces of the optical component 90, in particular thanks to the orientation at 90° between the first face 91 and the second face 94, the overall progressions 105 and 107 of the light beams associated with the homologous illumination functions according to the two different configurations intersect, in particular at 90°, as well as the overall progressions 106 and 108 of the light beams associated with the homologous imaging functions according to the two different configurations intersect, in particular at 90°.

As far as the characteristics of the two acquisition configurations are concerned, reference is fully made to what has been described with reference to the subsystems of the image acquisition device 1 of the first embodiment.

In particular, it should be noted that the second regions 102, 104 of the third and of the fourth faces 97, 98 form an additional surface of the common imaging lens 89, and therefore allow the field of view and/or the focal distance of the two acquisition configurations to be made different.

Also the optical acquisition device 81 can comprise an inner screen analogous to the screen 59 of the first embodiment, between the regions assigned to the illumination function (overall progressions 105 and 107) on the one side, and the regions assigned to the imaging function (overall progressions 106 and 108) on the other.

The optical acquisition device 81 can finally comprise an optical insulation cover 109, which preferably integrates an additional printed circuit.

The selection of the acquisition configuration of the image acquisition device 81 can take place only once or during the use of the image acquisition device 81, automatically or manually, as described above with reference to the second embodiment.

The image acquisition device 81 has the advantages outlined above with reference to the image acquisition device 1 of the first embodiment.

Also in this case, it is possible to extend or diversify the functions of the image acquisition device 81 by increasing the number of optically active regions of the various faces of the optical component 90, and arranging further optoelectronic components on the printed circuit 82, or to use it as an illumination section, as a receiving section, as a projection section of a luminous aiming or outcome indication figure, as a distance measurement section, as a presence detection section, or as an information transmission and/or reception section, in a totally analogous way to what has been described with reference to the first embodiment.

For example, the third face 97 and the fourth face 98 of the optical component 90 could each comprise four optically active regions arranged around their second regions 102, 104.

Then there shall be four further light emitters on the printed circuit 82, arranged around the sensor 84, so as to be optically associated with the four optically active regions of the third face 97 or of the fourth face 98, respectively in the two acquisition configurations of the image acquisition device 81.

The light emitters could for example be surface mounted light emitting diodes (LED SMD).

The four optically active regions of the third face 97 and of the fourth face 98 could be configured to shape and/or focus the beams of light emitted by the further emitters, so as to give the beams a shape suitable for identifying the corners and/or the edges of the fields of view of the two optical acquisition configurations of the image acquisition device 81, or so as to give the beams a shape and/or a colour suitable for indicating the outcome of the acquisition of an image, for example the successful reading of an optical code or failed reading, possibly also indicating the presumable reasons for the error.

For example, the four optically active regions of the third face 97 and of the fourth face 98 could be flat refractive surfaces, refractive surfaces locally defined arbitrary shape, or diffractive surfaces.

The aperturerd screen, if present, shall comprise suitable apertures optically associated with the further emitters and with the four optically active regions of the third face 97 or of the fourth face 98, respectively, in the two acquisition configurations of the image acquisition device 81.

There could also be light guides extending between the further emitters and the four optically active regions of the third face 97 or of the fourth face 98, respectively.

Alternatively, the further emitters could be glued to the optical component 90, behind the third and fourth faces 97, 98.

Similarly to the second embodiment, it is also possible to make any number of acquisition configurations by shaping the optical component with a polygonal cross-section having any even number of sides, i.e. hexagonal, octagonal, etc.

Alternatively or in addition to the inner screen, there can be screens of the side faces of the optical component 80, for rejecting light from the outside.

Figure 9:
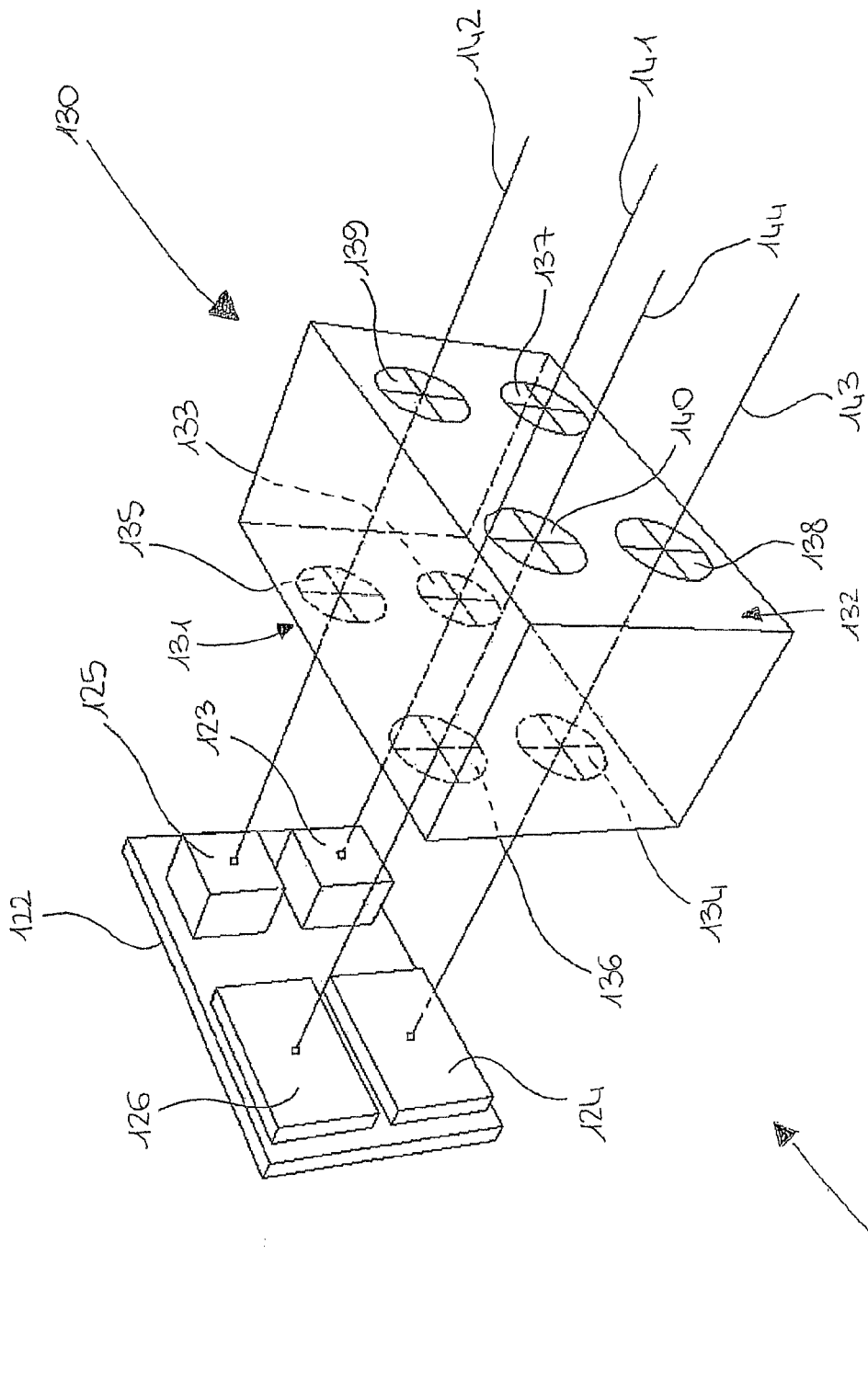
FIG. 9 illustrates a further optical acquisition device and an optical component thereof.

Finally, FIG. 9 shows an optical acquisition device 121 comprising a rectangular parallelepiped-shaped optical component 130, having a plurality of optically active regions 133 to 140 on two opposite faces 131, 132.

The optically active regions 133-136 of the first face 131 are optically associated with the optically active regions 137-140, respectively, of the second face 122, as well as with a first emitter 123, a first sensor 124, a second emitter 125, and a second sensor 126 of a printed circuit 122 facing the first face 131 of the optical component 130.

By suitably configuring the various optically active regions 133 to 140 and the optoelectronic elements 123-126 of the printed circuit 122, it is possible to obtain an optical acquisition device 121 integrating two different acquisition configurations.

The variants and additions described above with reference to the other embodiments can be applied to the optical acquisition device 121.

In all of the embodiments and variants described above, the various optically active regions are preferably integrally made in the optical component 20, 60, 90, 130, but they can also be lenses or optical elements deposited, glued or co-moulded onto it.

What is claimed is:

1. A single optical component of an image acquisition device, the single optical component comprising at least two faces each having a first optically active region, said first optically active regions of said at least two faces being assigned to optical functions homologous to each other, but according to different acquisition configurations differing in the value of at least one optical characteristic parameter, said at least two faces also defining respective reference planes, the normals to the reference planes being differently oriented.

2. The component according to claim 1, wherein said homologous optical functions are functions identically selected from the group consisting of beam shaping, imaging, aiming, indication, distance measurement including triangulation, presence detection, information transmission, information reception, information transmission/reception.

3. The component according to claim 1, wherein the normals to the reference planes form an angle of 90°.

4. The component according to claim 1, wherein said at least two faces each further comprise at least one second optically active region assigned to at least one optical function not homologous to the optical functions of said first optically active regions.

5. The component according to claim 4, wherein said at least one non-homologous optical function is selected, from the group consisting of illumination beam shaping, imaging, aiming, indication, distance measurement including triangulation, presence detection, information transmission, information reception, information transmission/reception.

6. The component according to claim 5, wherein said at least two faces comprise at least two pairs each formed of at least one optically active region assigned to an illumination beam shaping function and at least one optically active region assigned to an imaging function.

7. The component according to claim 1, wherein at least one region of at least one face is selected from the group consisting of a flat refractive surface, a refractive surface of locally defined arbitrary shape, a diffractive surface, and a polyhedral surface.

8. The component according to claim 1, wherein at least one region of at least one face is selected from the group consisting of a spherical refractive surface, an aspherical refractive surface, a toroidal refractive surface, and a diffractive surface.

9. The component according to claim 1, comprising at least one face having at least one region configured to deflect light internally of the component.

10. The component according to claim 1, comprising faces arranged along or parallel to the lateral surface of a right angle polyhedron with rectangular trapezium-shaped cross-section.

11. The component according to claim 10, wherein the face along the oblique side forms an angle of 45° with the face along the major base.

12. The component according to claim 10, wherein:

a minor base face and a right angle side face each comprise at least one first region that is flat refractive or refractive of locally defined arbitrary shape or diffractive, and a second region having the shape of a spherical refractive, aspherical refractive, toroidal refractive or diffractive surface;

an oblique side face is configured to deflect light internally of the optical component;

a major base face comprises at least one first region optically associated with the first region of the minor base face that is flat refractive, refractive of locally defined arbitrary shape or diffractive; a second region optically associated with the second region of the minor base face and having the shape of a spherical refractive, aspherical refractive, toroidal refractive or diffractive surface; a third region optically associated with the first region of the right angle side face through said oblique side face, that is flat refractive, refractive of locally defined arbitrary shape or diffractive; and a fourth region optically associated with the second region of the right angle side face through said oblique side face, and having the shape of a spherical refractive, aspherical refractive, toroidal refractive or diffractive surface.

13. The component according to claim 12, wherein said regions from the first to the fourth of said major base face are arranged as a square, and said major base face further comprises a central region; said minor base face comprises a further optically active region optically associated with the central region of the major base face; said central region and further optically active region being independently selected from the group consisting of flat refractive, refractive of locally defined arbitrary shape, diffractive or polyhedral surfaces.

14. The component according to claim 1, wherein the component further includes pairs of faces arranged parallel to one another.

15. The component according to claim 14, wherein each face comprises at least one first region that is flat refractive, refractive of locally defined arbitrary shape or diffractive, and at least two faces each comprise at least one second region having the shape of a spherical refractive, aspherical refractive, toroidal refractive or diffractive surface, the first regions of faces of a pair of faces parallel to each other being optically associated, and the second regions of faces of a pair of faces parallel to each other being optically associated.

16. The component according to claim 14, wherein said pairs of faces parallel to each other are two in number, the faces of one pair being perpendicular to the faces of the other pair.

17. The component according to claim 14, wherein said faces arranged in pairs parallel to each other are arranged along the sides of a polygon with an even number of sides.

18. The component according to claim 14, wherein at least one face has at least one further optically active region selected from the group consisting of a flat refractive, a refractive of locally defined arbitrary shape, diffractive and a polyhedral surface.

19. The component according to claim 18, wherein at least one light guide extends from said at least one further optically active region of said at least one face to a parallel face of said component.

20. The component according to claim 1, wherein said at least two faces are made of a plastic material.

21. The component according to claim 20, wherein said at least two faces are made by moulding.

22. The component according to claim 1, comprising an inner screen.

23. The component according to claim 1, wherein said component is monolithic.

24. A single optical component of an image acquisition device, the single optical component comprising at least two pairs each formed of at least one optically active region assigned to an illumination beam shaping function, and at least one optically active region assigned to an imaging function, said at least two pairs of optically active regions being configured according to different acquisition configurations differing in the value of at least one optical characteristic parameter.

25. An image acquisition device, comprising:
an optical component having at least two faces each having a first optically active region, said first optically active regions of said at least two faces being assigned to optical functions homologous to each other, but according to different acquisition configurations, said at least two faces defining respective reference planes, the normals to the reference planes being differently oriented; and
a printed circuit facing a face of said optical component.

26. The device according to claim 25, wherein said printed circuit comprises at least one light emitter and at least one image sensor, respectively optically associated with at least one optically active region of said component.

27. The device according to claim 25, further comprising at least one second printed circuit fixed parallel to a face of said component adjacent to said face to which said printed circuit can be fixed.

28. The device according to claim 27, wherein said second printed circuit comprises at least one light emitter and at least one image sensor, respectively optically associated with at least one optically active region of said component.

29. The device according to claim 28, further comprising electronics for driving said emitters and sensors of said first and second printed circuits.

30. The device according to claim 29, wherein said drive electronics comprise at least one detector of an acquisition condition and provides for switching on the emitter and the sensor of the first printed circuit or the emitter and the sensor of the second printed circuit based upon the detected acquisition condition.

31. The device according to claim 29, wherein said drive electronics provides for switching on the emitter and the sensor of the first printed circuit in a first half-cycle and the emitter and the sensor of the second printed circuit in a second half-cycle.

32. The device according claim 25, further comprising at least one apertured screen having at least one aperture optically associated with at least one region of at least one face of the optical component.

33. The device according to claim 25, further comprising a mechanism for rotating the optical component between a first acquisition configuration wherein said printed circuit faces a first face of said optical component, and at least one second acquisition configuration wherein said printed circuit faces a second face of said optical component.

34. The device according to claim 33, wherein said optical component is partially hollow and further comprising an imaging lens housed in the cavity of the optical component, and optically associated with at least one optically active region having imaging function of said optical component.

35. The device according to claim 26, further comprising at least one further light emitter associated with an aiming or indication function.

36. The device according to claim 25, wherein said device is selected among an optical code reader and an artificial vision and/or inspection system.

37. The device according to claim 36, wherein said device is an imaging optical code reader.

38. The device according to claim 37, wherein said device is a two-dimensional imaging optical code reader.

39. An optical component of an image acquisition device, comprising at least two faces each having a first optically active region, said first optically active regions of said at least two faces being assigned to optical functions homologous to each other, but according to different acquisition configurations, said at least two faces defining respective reference planes, the normals to the reference planes being differently oriented,
wherein the component comprises faces arranged along or parallel to the lateral surface of a right angle polyhedron with rectangular trapezium-shaped cross-section, and wherein:
a minor base face and a right angle side face each comprise at least one first region that is flat refractive or refractive of locally defined arbitrary shape or diffractive, and a second region having the shape of a spherical refractive, aspherical refractive, toroidal refractive or diffractive surface;
an oblique side face is configured to deflect light internally of the optical component; and
a major base face comprises at least one first region optically associated with the first region of the minor base face that is flat refractive, refractive of locally defined arbitrary shape or diffractive; a second region optically associated with the second region of the minor base face and having the shape of a spherical refractive, aspherical refractive, toroidal refractive or diffractive surface; a third region optically associated with the first region of the right angle side face through said oblique side face, that is flat refractive, refractive of locally defined arbitrary shape or diffractive; and a fourth region optically associated with the second region of the right angle side face through said oblique side face, and having the shape of a spherical refractive, aspherical refractive, toroidal refractive or diffractive surface.

40. The component according to claim 39, wherein said regions from the first to the fourth of said major base face are arranged as a square, and said major base face further comprises a central region; said minor base face comprises a further optically active region optically associated with the central region of the major base face; said central region and further optically active region being independently selected from the group consisting of flat refractive, refractive of locally defined arbitrary shape, diffractive or polyhedral surfaces.

* * * * *

UNITED STATES PATENT AND TRADEMARK OFFICE
CERTIFICATE OF CORRECTION

PATENT NO. : 8,413,902 B2  
APPLICATION NO. : 12/676068  
DATED : April 9, 2013  
INVENTOR(S) : Oliva et al.

Page 1 of 1

It is certified that error appears in the above-identified patent and that said Letters Patent is hereby corrected as shown below:

In the Claims

Claim 5, Column 23, line 29, delete the "," after the word "selected"

Claim 29, Column 25, line 26, delete "electonics" and insert therefor --electronics--

Signed and Sealed this  
Fifteenth Day of October, 2013

Teresa Stanek Rea  
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,413,902 B2 | Page 1 of 1 |
| APPLICATION NO. | : 12/676068 | |
| DATED | : April 9, 2013 | |
| INVENTOR(S) | : Oliva et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 404 days.

Signed and Sealed this
Eighth Day of April, 2014

Michelle K. Lee
*Deputy Director of the United States Patent and Trademark Office*